(12) United States Patent
Liu et al.

(10) Patent No.: US 11,942,577 B2
(45) Date of Patent: *Mar. 26, 2024

(54) OPTICAL DEVICE

(71) Applicant: GRIREM ADVANCED MATERIALS CO., LTD, Beijing (CN)

(72) Inventors: Ronghui Liu, Beijing (CN); Yuanhong Liu, Beijing (CN); Yanfeng Li, Beijing (CN); Xiaoxia Chen, Beijing (CN); Xiaole Ma, Beijing (CN); Yuan Xue, Beijing (CN)

(73) Assignee: GRIREM ADVANCED MATERIALS CO., LTD., Beijing (CN)

( * ) Notice: Subject to any disclaimer, the term of this patent is extended or adjusted under 35 U.S.C. 154(b) by 162 days.

This patent is subject to a terminal disclaimer.

(21) Appl. No.: 17/254,226

(22) PCT Filed: Aug. 22, 2019

(86) PCT No.: PCT/CN2019/102048
§ 371 (c)(1),
(2) Date: Dec. 18, 2020

(87) PCT Pub. No.: WO2021/031204
PCT Pub. Date: Feb. 25, 2021

(65) Prior Publication Data
US 2022/0173281 A1 Jun. 2, 2022

(51) Int. Cl.
*H01L 33/50* (2010.01)
*C09K 11/77* (2006.01)
*G02B 5/20* (2006.01)
*H01L 33/30* (2010.01)

(52) U.S. Cl.
CPC ........ *H01L 33/504* (2013.01); *C09K 11/7716* (2013.01); *C09K 11/77217* (2021.01); *G02B 5/208* (2013.01); *H01L 33/30* (2013.01)

(58) Field of Classification Search
CPC ........ G02B 5/00–32; C09K 11/00–897; H01L 33/00–648
See application file for complete search history.

(56) References Cited

U.S. PATENT DOCUMENTS

2021/0015052 A1* 1/2021 Li .................. A01G 7/045

FOREIGN PATENT DOCUMENTS

CN 108630794 A * 10/2018 ........... H01L 33/504

* cited by examiner

*Primary Examiner* — Bao-Luan Q Le
*Assistant Examiner* — Christopher A Lamb, II
(74) *Attorney, Agent, or Firm* — Westbridge IP LLC

(57) ABSTRACT

An optical device includes an LED chip, a light absorber and/or visible-light luminescent material, and a near-infrared luminescent material, wherein a luminous power of light emitted by the near-infrared luminescent material and the light absorber and/or visible-light luminescent material in a band of 650-1000 nm under the excitation of the LED chip is A, and a sum of a luminous power of light emitted by the near-infrared and visible-light luminescent materials in a band of 350-650 nm under the excitation of the LED chip and a luminous power of residual light emitted by the LED chip in the band of 350-650 nm after the LED chip excites the near-infrared and visible-light luminescent materials is B, with B/A*100% being 0.1%-10%. According to the implementation where the optical device employs the LED chip to combine the near-infrared luminescent material and the light absorber and/or visible-light luminescent material simultaneously.

12 Claims, 1 Drawing Sheet

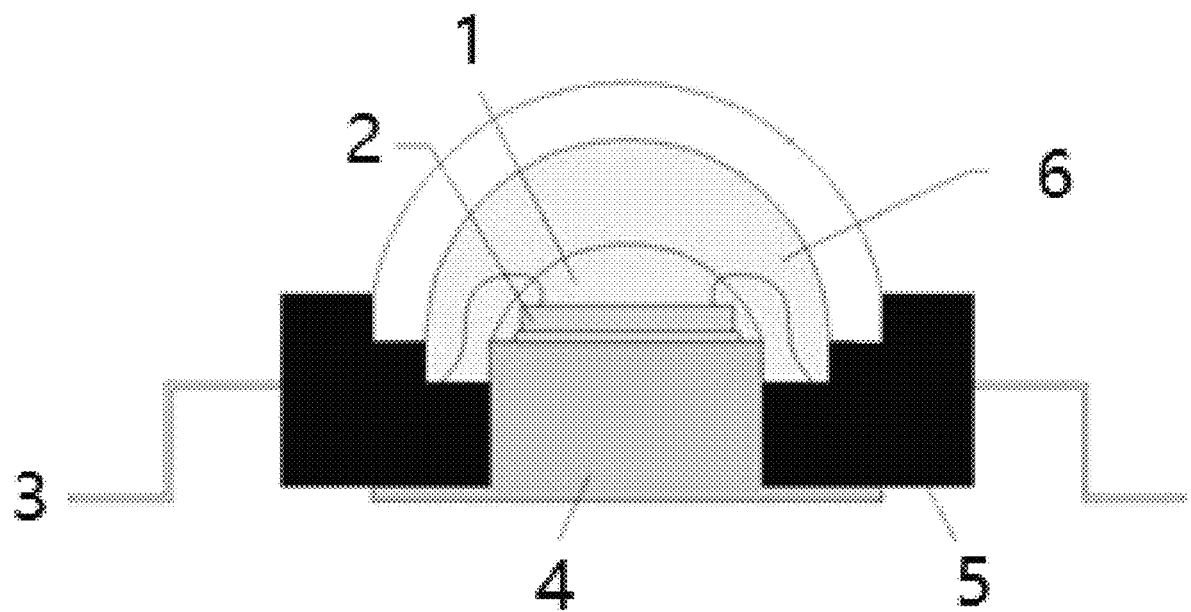

OPTICAL DEVICE

CROSS-REFERENCE TO RELATED APPLICATIONS

This application is a national stage application of PCT/CN2019/102048. This application claims priorities from PCT Application No. PCT/CN2019/102048, filed Aug. 22, 2019, and from the Chinese patent application 201910779664.5 filed Aug. 22, 2019, the content of which is incorporated herein in the entirety by reference.

TECHNICAL FIELD

The present invention relates to the field of infrared optics technologies, and in particular to an optical device including an LED chip, a light absorber and/or visible-light luminescent material, and a near-infrared luminescent material.

BACKGROUND

In recent years, the application of near-infrared light in the fields such as security monitoring, biometric identification, 3D sensing, and food/medical testing has become a focus at home and abroad. Due to good directivity, low power consumption, small size and a number of other advantages, near-infrared LEDs have become an international research hotspot. At present, the near-infrared LEDs are mainly implemented by means of near-infrared semiconductor chips. For example, infrared chips in bands of 730 nm, 750 nm, 850 nm and 940 nm are mainly applied in the security field. In particular, short-wave infrared chips may bring about very serious red-light bursts during usage. In general, one or more white-light LEDs are further provided externally to compensate for light during the detection at night and reduce the red-light bursts caused by the infrared chips. In this implementation, a drive current for a white-light LED bead is greatly different from that for an infrared LED bead, which affects the service life of the whole light-emitting device. In addition, the infrared chips are relatively expensive, and a process for packaging a plurality of infrared chips is complex and is high in cost, which limits the application and promotion of infrared LED optical devices.

A method for packaging by combining an LED chip with a near-infrared luminescent material has the advantages of simple preparation process, low cost, high luminous efficiency and the like. Moreover, the near-infrared luminescent material is rich in emission wavelength, and can produce various specific wavelengths for near-infrared applications. At present, the major problem of this implementation is that a luminous power of near-infrared light still needs to be further improved, and a luminous power of white light is difficult to adjust in a controllable way.

SUMMARY

An objective of the present invention is to provide an optical device that combines an LED chip, a light absorber and/or visible-light luminescent material, and a near-infrared luminescent material. The optical device emits near-infrared light and visible light simultaneously by using the same type of LED chip, and has the advantage of no red-light burst, which greatly simplifies a packaging process, reduces the packaging cost, and meanwhile, makes it possible to adjust and control a white-light component in a spectrum.

To achieve the above objective of the present invention, the present invention has the following technical solutions.

An optical device includes an LED chip, a light absorber and/or visible-light luminescent material, and a near-infrared luminescent material, wherein a luminous power of light emitted by the near-infrared luminescent material and the light absorber and/or visible-light luminescent material in a band of 650-1000 nm under the excitation of the LED chip is A, and a sum of a luminous power of light emitted by the near-infrared and visible-light luminescent materials in a band of 350-650 nm under the excitation of the LED chip and a luminous power of residual light emitted by the LED chip in the band of 350-650 nm after the LED chip excites the near-infrared and visible-light luminescent materials is B, with $B/A*100\%$ being 0.1%-10%.

The LED chip in the present invention is the same type of LED chip, such as a blue-light LED chip. One or a plurality of blue-light LED chips may coexist to enhance the luminous power of the emitted near-infrared light.

Preferably, the LED chip has a peak-emission wavelength in a range of 420-470 nm.

Preferably, the light absorber has a molecular formula being one or two of $(La,Y,Lu)_{3-x}Si_6N_{11}:xCe^{3+}$ and $(Lu,Y,Gd)_{3-y}(Al,Ga)_5O_{12}:yCe^{3+}$, with $0.35 \leq x \leq 1.5$ and $0.15 \leq y \leq 0.45$.

Preferably, the light absorber may absorb an emitted light with a peak-emission wavelength of 420-470 nm, and emit visible light in a band of 500-780 nm under the excitation at 460 nm, and the external quantum efficiency of the light absorber is 0.001-0.05.

Preferably, the near-infrared luminescent material includes one of molecular formulas including $aSc_2O_3 \cdot A_2O_3 \cdot bCr_2O_3$ and $Ln_2O_3 \cdot cE_2O_3 \cdot dCr_2O_3$, wherein the element A contains at least one of elements Al and Ga and necessarily contains the element Ga; the element Ln contains at least one of elements Y, Lu, and Gd and necessarily contains the element Y; the element E contains at least one of elements Al and Ga and necessarily contains the element Ga, with $0.0014 \leq a \leq 0.6$, $0.001 \leq b \leq 0.1$, $1.5 \leq c \leq 2$ and $0.001 \leq d \leq 0.2$; and the two molecular formulas have a β-$Ga_2O_3$ structure and a garnet structure, respectively.

Preferably, the visible-light luminescent material has one or two of molecular formulas including $(La,Y,Lu)_{3-e}Si_6N_{11}:eCe^{3+}$ and $(Lu,Y,Gd)_{3-z}(Al,Ga)_5O_{12}:zCe^{3+}$, with $0.001 \leq e < 0.15$ and $0.001 \leq z < 0.15$.

Preferably, the near-infrared luminescent material includes one of molecular formulas including $aSc_2O_3 \cdot A_2O_3 \cdot bCr_2O_3$ and $Ln_2O_3 \cdot cE_2O_3 \cdot dCr_2O_3$, wherein the element A contains at least one of elements Al and Ga and necessarily contains the element Ga; the element Ln contains at least one of elements Y, Lu, and Gd and necessarily contains the element Y; the element E contains at least one of elements Al and Ga and necessarily contains the element Ga, with $0.001 \leq a \leq 0.6$, $0.001 \leq b \leq 0.1$, $1.5 \leq c \leq 2$ and $0.001 \leq d \leq 0.2$; and the two molecular formulas have a β-$Ga_2O_3$ structure and a garnet structure, respectively.

Preferably, the near-infrared luminescent material of the β-$Ga_2O_3$ structure may further contain an element In.

Preferably, the near-infrared luminescent material has a median grain size D50 of 15-40 μm, and a mass of the near-infrared luminescent material accounts for 50-80% of a sum of the mass of the near-infrared luminescent material and a mass of the visible-light luminescent material.

Preferably, the near-infrared luminescent material is located above the LED chip, and the light absorber and/or visible-light luminescent material is located above the near-infrared luminescent material.

In summary, the present invention provides an optical device, which includes an LED chip, a light absorber and/or visible-light luminescent material and a near-infrared luminescent material, wherein a luminous power of light emitted by the near-infrared luminescent material and the light absorber and/or visible-light luminescent material in a band of 650-1000 nm under the excitation of the LED chip is A; a luminous power of light emitted by the near-infrared luminescent material and the light absorber and/or visible-light luminescent material in a band of 350-650 nm under the excitation of the LED chip is B; and a luminous power of residual light emitted by the LED chip in the band of 350-650 nm after the LED chip excites the near-infrared luminescent material and the light absorber and/or visible-light luminescent material is C, with $(B+C)/A*100\%$ being 0.1%-10%.

Compared with the prior art, the present invention has the following beneficial effects:

(1) according to the implementation where the optical device employs the LED chip to combine the near-infrared luminescent material and the visible-light luminescent material, the emissions of near-infrared light and visible light are simultaneously enabled by using the same type of LED chip, which greatly simplifies a packaging process and reduces the packaging cost;

(2) the optical device has the characteristics of high luminous efficiency/excellent reliability, strong anti-jamming capability, white-light compensation and the like; and (3) the optical device with the combination of visible-light and near-infrared light according to the present invention can eliminate the red-light bursts and make it possible to adjust and control the luminous power of the white light part, and has good application prospects in security monitoring and other fields.

BRIEF DESCRIPTION OF THE DRAWINGS

FIG. 1 illustrates a schematic diagram of a light-emitting device according to a preferred embodiment of the present invention.

Reference signs: 1—near-infrared luminescent material layer, 2—semiconductor chip, 3—pin, 4—heat sink, 5—base, 6—light absorber material.

DETAILED DESCRIPTION

To present the objective, technical solutions and advantages of the present invention more clearly, the present invention will be further described in detail below in conjunction with specific embodiments and with reference to the accompanying drawings. It should be understood that these descriptions are merely for an illustrative purpose, and not intended to limit the scope of the present invention. In addition, the description of well-known structures and technologies is omitted in the following illustrations, in order to avoid unnecessarily obscuring the concept of the present invention.

The present invention provides an optical device, which includes an LED chip, a light absorber and/or visible-light luminescent material, and a near-infrared luminescent material, wherein a luminous power of light emitted by the near-infrared luminescent material and the light absorber and/or visible-light luminescent material in a band of 650-1000 nm under the excitation of the LED chip is A, and a sum of a luminous power of light emitted by the near-infrared and visible-light luminescent materials in a band of 350-650 nm under the excitation of the LED chip and a luminous power of residual light emitted by the LED chip in the band of 350-650 nm after the LED chip excites the near-infrared and visible-light luminescent materials is B, with $B/A*100\%$ being 0.1%-10%.

The light emitted in the band of 350-650 nm in the optical device mainly plays a role of weakening red-light bursts brought about by the light emitted in the band of 650-1000 nm. However, a strong visual impact may be caused when the luminous power of the light emitted in the band of 350-650 nm is excessively high, resulting in dizziness induced by the white light. Therefore, $B/A*100\%$ is implemented as 0.1%-10% according to the technical solution of the present invention.

Preferably, the LED chip has a peak-emission wavelength in a range of 420-470 nm.

Preferably, the light absorber has a molecular formula being one or two of $(La,Y,Lu)_{3-x}Si_6N_{11}:xCe^{3+}$ and $(Lu,Y,Gd)_{3-y}(Al,Ga)_5O_{12}:yCe^{3+}$, with $0.35 \leq x \leq 1.5$ and $0.15 \leq y \leq 0.45$.

Preferably, the light absorber may absorb an emitted light with a peak-emission wavelength of 420-470 nm, and emit visible light in a band of 500-780 nm under the excitation at 460 nm, and the external quantum efficiency of the light absorber is 0.001-0.05. The light absorber mainly plays a role of absorbing the residual light emitted by the LED chip after the LED chip excites the visible-light and near-infrared luminescent materials. The luminous power of the visible light may be insufficient when the external quantum efficiency of the light absorber is excessively low, and the residual emitted visible light may be excessively strong when the external quantum efficiency is excessively high. As such, the luminous power of the visible light and the infrared light cannot be controlled effectively.

Preferably, the near-infrared luminescent material includes one of molecular formulas including $aSc_2O_3 \cdot A_2O_3 \cdot bCr_2O_3$ and $Ln_2O_3 \cdot cE_2O_3 \cdot dCr_2O_3$, wherein the element A contains at least one of elements Al and Ga and necessarily contains the element Ga; the element Ln contains at least one of elements Y, Lu, and Gd and necessarily contains the element Y; the element E contains at least one of elements Al and Ga and necessarily contains the element Ga, with $0.001 \leq a \leq 0.6$, $0.001 \leq b \leq 0.1$, $1.5 \leq c \leq 2$ and $0.001 \leq d \leq 0.2$; and the two molecular formulas have a $\beta$-$Ga_2O_3$ structure and a garnet structure, respectively.

Preferably, the visible-light luminescent material has one or two of molecular formulas including $(La,Y,Lu)_{3-e}Si_6N_{11}:eCe^{3+}$ and $(Lu,Y,Gd)_{3-z}(Al,Ga)_5O_{12}:zCe^{3+}$, with $0.001 \leq e \leq 0.15$ and $0.001 \leq z \leq 0.15$. According to this optical device, each element in the brackets in the molecular formula of the visible-light luminescent material may exist alone or as two or three co-existing elements, and is mainly directed to adjust properties such as emission wavelength, peak width at half height and luminous intensity of the visible-light luminescent material. To adjust the comprehensive properties such as color coordinates, color temperature, color rendering ability and luminous power of the optical device, the visible-light luminescent material may further contain $(Ca,Sr,Ba)_2Si_5N_8:Eu^{2+}$, $(Sr,Ca)AlSiN_3:Eu^{2+}$, $(Ba,Ca,Sr)Si_2O_2N_2:Eu^{2+}$ and $\beta$-SiAlON:$Eu^{2+}$, and one or a plurality of visible-light luminescent materials may be used for adjusting light color parameters of the optical device.

Preferably, the near-infrared luminescent material includes one of molecular formulas including $aSc_2O_3 \cdot A_2O_3 \cdot bCr_2O_3$ and $Ln_2O_3 \cdot cE_2O_3 \cdot dCr_2O_3$, wherein the element A contains at least one of elements Al and Ga and necessarily contains the element Ga; the element Ln contains at least one of elements Y, Lu, and Gd and necessarily contains the element Y; the element E contains at least one of elements Al and Ga and necessarily contains the element Ga, with $0.001 \leq a \leq 0.6$, $0.001 \leq b \leq 0.1$, $1.5 \leq c \leq 2$ and $0.001 \leq d \leq 0.2$; and the two molecular formulas have a $\beta$-$Ga_2O_3$ structure and a garnet structure, respectively.

Preferably, the near-infrared luminescent material of the $\beta$-$Ga_2O_3$ structure may further contain the element In. The introduction of the element In in said near-infrared luminescent material of the $\beta$-$Ga_2O_3$ structure may allow the luminescent performance of the near-infrared luminescent material to be further adjusted and controlled.

Preferably, the near-infrared luminescent material has a median grain size D50 of 15-40 µm, and the mass of the near-infrared luminescent material accounts for 50-80% of the sum of the mass of the near-infrared luminescent material and a mass of the visible-light luminescent material. The median grain size D50 of the near-infrared luminescent material directly contributes to the luminescent performance in an infrared band. The near-infrared luminescent material having the median grain size D50 of more than 15 µm is preferred, which may significantly enhance the intensity of the luminous power in the infrared band. However, the median grain size D50 is at most 40 µm, since oversize grains may affect the transmission effectiveness of the near-infrared light and thus reduce the luminous power of the near-infrared light.

Preferably, the near-infrared luminescent material is located above the LED chip, and the light absorber and/or visible-light luminescent material is located above the near-infrared luminescent material. By providing the near-infrared luminescent material above the LED chip, it can be guaranteed that the near-infrared luminescent material effectively absorbs the light emitted by the LED chip, thereby achieving high luminous power for the emitted near-infrared light. By providing the light absorber and/or visible-light luminescent material above the near-infrared luminescent material, the light emitted in the band of 350-650 nm in the optical device may be controlled on the whole, making it possible to adjust and control the luminous power of the light emitted in the two bands of 350-650 nm and 650-1000 nm.

In addition, the protection scope of the present invention is not limited to the specific forms of the molecular formulas mentioned in all the materials described above, and fine-tuning the range of an element content to achieve an effect similar to that achieved according to the present invention shall be still deemed as falling within the protection scope claimed by the present patent. For example, fine-tuning the element contents in the molecular formula $(La,Y,Lu)_3Si_6N_{11}:Ce^{3+}$ within the ranges of 2-4, 5-7 and 8-13 respectively to achieve a similar inventive effect shall be still deemed as falling within the protection scope of the present patent for invention.

There is no limit to the specific method for preparing the optical device according to the present invention. However, the luminous power of the optical device may be improved with the following preparation methods.

An LED chip is fixed on a rack and a heat sink, and then circuits are well soldered. Powdered materials of the light absorber and/or visible-light luminescent material and the near-infrared luminescent material according to the present invention are evenly mixed with silica gel or resin at a ratio respectively or simultaneously, and then stirred and defoamed to obtain a fluorescent conversion layer material, which is dispensed or sprayed to cover the LED chip and cured by baking. Finally, packaging is performed to obtain the desired LED light-emitting device. Alternatively, the powdered materials of the light absorber and/or visible-light luminescent material and the near-infrared luminescent material are blended into and evenly mixed into a glass material or a plastic material at ratios according to the present invention, and then prepared into fluorescent glass or fluorescent plastic according to a conventional method for preparing the glass material or the plastic material, or directly fired to form fluorescent ceramic. Then, the fluorescent glass, the fluorescent plastic or the fluorescent ceramic is combined with the LED chip and then packaged to obtain the optical device according to the present invention.

The following provides examples and embodiments of the present invention merely for a purpose of illustrating the near-infrared optical device involved in the present invention. However, the present invention is not limited to these examples or embodiments.

Embodiment 1

An optical device included the following component parts: a blue-light LED chip with a wavelength of 440 nm, a light absorber material with a molecular formula of $Y_{2.65}Ga_5O_{12}:0.35Ce^{3+}$, and a near-infrared luminescent material with a molecular formula of $Y_2O_3 \cdot 1.6Ga_2O_3 \cdot 0.06Cr_2O_3$, wherein the near-infrared luminescent material had a grain size D50 of 18 µm, and had a mass accounting for 65% of the total mass of all the luminescent materials; and the external quantum efficiency of the light absorber material was 0.003. The near-infrared luminescent material according to the present invention was evenly mixed with a resin, then stirred and defoamed to obtain a near-infrared fluorescent conversion layer mixture, which was then sprayed to cover a surface of the LED chip and cured by baking to form a near-infrared fluorescence layer. Then, the light absorber material was evenly mixed with silica gel, applied to an upper surface of the near-infrared fluorescent conversion layer, and cured. Then, packaging was performed to obtain the desired LED light-emitting device. A lighting test was performed with 1000 mA current, and said light-emitting device had a white-light luminous flux of 3.5 lm, a total luminous power of 749 mW in a band of 350 nm-1000 nm, a luminous power A of 720 mW in a band of 650 nm-1000 nm, and a luminous power B of 29 mW in a band of 350 nm-650 nm, with a luminous power ratio $B/A*100\%=4\%$.

The preparation methods and the structures of the light-emitting devices in Embodiments 2-4 are the same as those in Embodiment 1, and may be obtained just by mixing the luminescent materials and the light absorber materials in respective embodiments at their respective ratios according to their molecular formulas and performance characteristics.

Embodiment 5

An optical device included the following component parts: a blue-light LED chip with a wavelength of 455 nm, a light absorber material with a molecular formula of $Y_{2.65}Ga_5O_{12}:0.35Ce^{3+}$, a visible-light material with a molecular formula of $La_{2.9}Si_6N_{11}:0.1Ce^{3+}$, and a near-infrared luminescent material with a molecular formula of $Y_2O_3 \cdot 1.6Ga_2O_3 \cdot 0.06Cr_2O_3$, wherein the near-infrared luminescent material had a grain size D50 of 30 µm, and had a mass accounting for 80% of the total mass of all the luminescent materials; and the external quantum efficiency of the light absorber material was 0.003. The near-infrared luminescent material according to the present invention was evenly mixed with silica gel, then stirred and defoamed to obtain a near-infrared fluorescent conversion layer mixture, which was dispensed to cover a surface of the LED chip and cured by baking. Then, the light absorber material was evenly mixed with silica gel, applied to an upper surface of the near-infrared fluorescent conversion layer, and then cured. In a third step, the visible-light luminescent material was evenly mixed with the silica gel, applied to an upper surface of the light absorber layer, and then cured. Packaging was performed to obtain the desired LED light-emitting device. A lighting test was performed with 1000 mA current, and said light-emitting device had a white-light luminous flux of 10 lm, a total luminous power of 666 mW in a band of 350 nm-1000 nm, a luminous power A of 640 mW in a band of 650 nm-1000 nm, and a luminous power B of 26 mW in a band of 350 nm-650 nm, with a luminous power ratio B/A*100%=4%.

The preparation methods and the structures of the light-emitting devices in Embodiments 6-9 are the same as those in Embodiment 5, and may be obtained just by mixing the luminescent materials and the light absorber materials in respective embodiments at their respective ratios according to their molecular formulas and performance characteristics.

Embodiment 10

An optical device included the following component parts: a blue-light LED chip with a wavelength of 420 nm, a light absorber material with a molecular formula of $Y_{2.65}Ga_5O_{12}:0.35Ce^{3+}$, a visible-light material with a molecular formula of $La_{2.9}Si_6N_{11}:0.1Ce^{3+}$, and a near-infrared luminescent material with a molecular formula of $(Y_{0.7}Al_{0.3})_2O_3 \cdot 1.6Ga_2O_3 \cdot 0.04Cr_2O_3$, wherein the near-infrared luminescent material had a grain size D50 of 38 μm, and had a mass accounting for 80% of the total mass of all the luminescent materials; and the external quantum efficiency of the light absorber material was 0.003. The near-infrared luminescent material according to the present invention was evenly mixed with silica gel, then stirred and defoamed to obtain a near-infrared fluorescent conversion layer mixture, which was dispensed to cover a surface of the LED chip and cured by baking. Then, the visible-light luminescent material and the light absorber material were evenly mixed with the silica gel, applied to an upper surface of the near-infrared luminescent material layer, and then cured. Packaging was performed to obtain the desired LED light-emitting device. A lighting test was performed with 1000 mA current, and said light-emitting device had a white-light luminous flux of 9 lm, a total luminous power of 631 mW in a band of 350 nm-1000 nm, a luminous power A of 590 mW in a band of 650 nm-1000 nm, and a luminous power B of 41 mW in a band of 350 nm-650 nm, with a luminous power ratio B/A*100%=7%.

The preparation methods and the structures of the light-emitting devices in Embodiments 11 and 12 are the same as those in Embodiment 10, and may be obtained just by mixing the luminescent materials and the light absorber materials in respective embodiments at their respective ratios according to their molecular formulas and performance characteristics.

Embodiment 13

An optical device included the following component parts: a blue-light LED chip with a wavelength of 455 nm, a visible-light material with a molecular formula of $La_{2.9}Si_6N_{11}:0.1Ce^{3+}$, and a near-infrared luminescent material with a molecular formula of $Y_2O_3 \cdot 1.6Ga_2O_3 \cdot 0.03Cr_2O_3$, wherein the near-infrared luminescent material had a grain size D50 of 15 μm, and had a mass accounting for 70% of the total mass of all the luminescent materials. The near-infrared luminescent material according to the present invention was evenly mixed with a resin, then stirred and defoamed to obtain a near-infrared fluorescent conversion layer mixture, which was then sprayed to cover a surface of the LED chip and cured by baking to form a near-infrared fluorescent conversion layer. Then, the visible-light material was evenly mixed with silica gel, applied to an upper surface of the near-infrared fluorescent conversion layer, and then cured. Then, packaging was performed to obtain the desired LED light-emitting device. A lighting test was performed with 1000 mA current, and said light-emitting device had a white-light luminous flux of 20 lm, a total luminous power of 634 mW in a band of 350 nm-1000 nm, a luminous power A of 610 mW in a band of 650 nm-1000 nm, and a luminous power B of 24 mW in a band of 350 nm-650 nm, with a luminous power ratio B/A*100%=4%.

Embodiment 14

An optical device included the following component parts: a blue-light LED chip with a wavelength of 455 nm, a visible-light material with a molecular formula of $La_{2.9}Si_6N_{11}:0.1Ce^{3+}$, and a near-infrared luminescent material with a molecular formula of $0.6Sc_2O_3 \cdot Ga_2O_3 \cdot 0.1Cr_2O_3$, wherein the near-infrared luminescent material had a grain size D50 of 35 μm, and had a mass accounting for 80% of the total mass of all the luminescent materials. The near-infrared luminescent material according to the present invention was mixed with silica gel, then stirred and defoamed to obtain a near-infrared fluorescent conversion layer mixture, which was dispensed to cover a surface of the LED chip and then cured by baking. Then, the visible-light luminescent material was evenly mixed with silica gel, applied to an upper surface of the near-infrared fluorescent conversion layer, and then cured. Packaging was performed to obtain the desired LED light-emitting device. A lighting test was performed with 1000 mA current, and said light-emitting device had a white-light luminous flux of 18 lm, a total luminous power of 657 mW in a band of 350 nm-1000 nm, a luminous power A of 608 mW in a band of 650 nm-1000 nm, and a luminous power B of 49 mW in a band of 350 nm-650 nm, with a luminous power ratio B/A*100%=8%.

The preparation methods and the structures of the light-emitting devices in Embodiments 15 and 16 are the same as those in Embodiment 14, and may be obtained just by mixing the luminescent materials and the light absorber materials in respective embodiments at their respective ratios according to their molecular formulas and performance characteristics.

Embodiment 17

An optical device included the following component parts: a blue-light LED chip with a wavelength of 470 nm, a light absorber material with a molecular formula of $(Lu_{0.3}Y_{0.7})_{2.6}(Al_{0.8}Ga_{0.2})_5O_{12}:0.4Ce^{3+}$, and a near-infrared luminescent material with an external quantum efficiency of 0.006 and a molecular formula of $Y_2O_3 \cdot 1.6Ga_2O_3 \cdot 0.06Cr_2O_3$, wherein the near-infrared luminescent material had a grain size D50 of 28 μm, and had a mass accounting for 78% of the total mass of all the luminescent materials. The near-infrared and visible-light materials according to the present invention were prepared into fluorescent ceramic sheets respectively. The near-infrared fluorescent ceramic sheets were combined above the LED chip. The visible-light fluorescent ceramic sheets were then combined above the near-infrared fluorescent ceramic sheets. Then, packaging was performed to obtain the optical device. A lighting test was performed with 1000 mA current, and said light-emitting device had a white-light luminous flux of 5.8 lm, a total luminous power of 657 mW in a band of 350 nm-1000 nm, a luminous power A of 620 mW in a band of 650 nm-1000 nm, and a luminous power B of 37 mW in a band of 350 nm-650 nm, with a luminous power ratio B/A*100%=6%.

Embodiment 18

An optical device included the following component parts: a blue-light LED chip with a wavelength of 480 nm, a light absorber material with a molecular formula of $La_{1.5}Si_6N_{11}:1.5Ce^{3+}$, and a near-infrared luminescent material with an external quantum efficiency of 0.01 and a molecular formula of $Y_2O_3 \cdot 2(Ga_{0.5}Al_{0.5})_2O_3 \cdot 0.03Cr_2O_3$, wherein the near-infrared luminescent material had a grain size D50 of 45 μm, and had a mass accounting for 60% of the total mass of all the luminescent materials. The near-infrared and light absorber materials were blended into a glass material and prepared into near-infrared fluorescent glass and visible-light fluorescent glass respectively. The near-infrared fluorescent glass was then combined with the LED chip. The visible-light fluorescent glass covered an upper layer of the near-infrared fluorescent glass. Then, packaging was performed to obtain the optical device. A lighting test was performed with 1000 mA current, and said light-emitting device had a white-light luminous flux of 4.5 lm, a total luminous power of 704 mW in a band of 350 nm-1000 nm, a luminous power A of 658 mW in a band of 650 nm-1000 nm, and a luminous power B of 46 mW in a band of 350 nm-650 nm, with a luminous power ratio B/A*100%=7%.

Table 1 below shows the compositions and luminescent performances of the luminescent materials and light absorber materials in all the embodiments of the present invention.

TABLE 1

| Name | Light absorber material | Visible-light material | Near-infrared luminescent material Molecular formula |
|---|---|---|---|
| Embodiment 1 | $Y_{2.65}Ga_5O_{12}:0.35Ce^{3+}$ | | $Y_2O_3 \cdot 1.6Ga_2O_3 \cdot 0.06Cr_2O_3$ |
| Embodiment 2 | $Y_{2.7}Al_5O_{12}:0.3Ce^{3+}$ | | $(Y_{0.9}Lu_{0.1})_2O_3 \cdot 1.6(Ga_{0.9}Al_{0.1})_2O_3 \cdot 0.03Cr_2O_3$ |
| Embodiment 3 | $(Lu_{0.5}Y_{0.5})_{2.6}(Al_{0.5}Ga_{0.5})_5O_{12}:0.4Ce^{3+}$ | | $Y_2O_3 \cdot 1.6Ga_2O_3 \cdot 0.06Cr_2O_3$ |
| Embodiment 4 | $La_{1.5}Si_6N_{11}:1.5Ce^{3+}$ | | $0.3Sc_2O_3 \cdot Ga_2O_3 \cdot 0.05Cr_2O_3$ |
| Embodiment 5 | $Y_{2.65}Ga_5O_{12}:0.35Ce^{3+}$ | $La_{2.9}Si_6N_{11}:0.1Ce^{3+}$ | $Y_2O_3 \cdot 1.6Ga_2O_3 \cdot 0.06Cr_2O_3$ |
| Embodiment 6 | $(Y_{0.5}Lu_{0.5})_{2.85}Ga_5O_{12}:0.15Ce^{3+}$ | $Y_{2.85}Al_5O_{12}:0.15Ce^{3+}$ | $0.3Sc_2O_3 \cdot (Ga_{0.8}Al_{0.2})_2O_3 \cdot 0.05Cr_2O_3$ |
| Embodiment 7 | $(Lu_{0.5}Y_{0.5})_{2.85}Al_5O_{12}:0.15Ce^{3+}$ | $(La_{0.1}Lu_{0.9})_{2.999}Si_6N_{11}:0.001Ce^{3+}$ | $0.3Sc_2O_3 \cdot Ga_2O_3 \cdot 0.05Cr_2O_3 \cdot 0.01In_2O_3$ |
| Embodiment 8 | $(Lu_{0.2}Y_{0.7}Gd_{0.1})_{2.7}(Al_{0.1}Ga_{0.9})_5O_{12}:0.3Ce^{3+}$ | $(Lu_{0.5}Y_{0.5})_{2.9}Al_5O_{12}:0.1Ce^{3+}$ | $Y_2O_3 \cdot 2Ga_2O_3 \cdot 0.06Cr_2O_3$ |
| Embodiment 9 | $Gd_{2.55}Ga_5O_{12}:0.45Ce^{3+}$ | $Y_{2.85}Si_6N_{11}:0.15Ce^{3+}$ | $Y_2O_3 \cdot 1.5(Ga_{0.5}Al_{0.5})_2O_3 \cdot 0.2Cr_2O_3$ |
| Embodiment 10 | $Y_{2.65}Ga_5O_{12}:0.35Ce^{3+}$ | $La_{2.9}Si_6N_{11}:0.1Ce^{3+}$ | $(Y_{0.7}Al_{0.3})_2O_3 \cdot 1.6Ga_2O_3 \cdot 0.04Cr_2O_3$ |
| Embodiment 11 | $(Lu_{0.1}Y_{0.9})_{2.85}Al_5O_{12}:0.15Ce^{3+}$ | $Y_{2.9}(Al_{0.8}Ga_{0.2})_5O_{12}:0.1Ce^{3+}$ | $(Y_{0.8}Lu_{0.2})_2O_3 \cdot 1.6Ga_2O_3 \cdot 0.05Cr_2O_3$ |
| Embodiment 12 | $La_{2.65}Si_6N_{11}:0.35Ce^{3+}$ | $La_{2.9}Si_6N_{11}:0.1Ce^{3+}$ | $(Y_{0.6}Al_{0.2}Lu_{0.2})_2O_3 \cdot 1.6Ga_2O_3 \cdot 0.001Cr_2O_3$ |
| Embodiment 13 | | $La_{2.9}Si_6N_{11}:0.1Ce^{3+}$ | $Y_2O_3 \cdot 1.6Ga_2O_3 \cdot 0.03Cr_2O_3$ |
| Embodiment 14 | | $La_{2.9}Si_6N_{11}:0.1Ce^{3+}$ | $0.6Sc_2O_3 \cdot Ga_2O_3 \cdot 0.1Cr_2O_3$ |
| Embodiment 15 | | $Sr_{1.5}Si_5N_8:0.5Eu^{2+}$, $Ba_{0.95}Si_2O_2N_2:0.05Eu^{2+}$ | $(Y_{0.9}Gd_{0.1})_2O_3 \cdot 1.6Ga_2O_3 \cdot 0.06Cr_2O_3$ |
| Embodiment 16 | | $(Sr_{0.1}Ca_{0.9})AlSiN_3:0.1Eu^{2+}$, $Si_{5.8}Al_{0.2}O_{0.18}N_{7.82}:0.01Eu^{2+}$ | $Y_2O_3 \cdot 1.6Ga_2O_3 \cdot 0.06Cr_2O_3$ |
| Embodiment 17 | $(Lu_{0.3}Y_{0.7})_{2.6}(Al_{0.8}Ga_{0.2})_5O_{12}:0.4Ce^{3+}$ | | $Y_2O_3 \cdot 1.6Ga_2O_3 \cdot 0.06Cr_2O_3$ |
| Embodiment 18 | $La_{1.5}Si_6N_{11}:1.5Ce^{3+}$ | | $Y_2O_3 \cdot 2(Ga_{0.5}Al_{0.5})_2O_3 \cdot 0.03Cr_2O_3$ |

| Name | Mass ratio of near-infrared luminescent material to all the luminescent materials | D50 of near-infrared luminescent material | External quantum efficiency of light absorber | White-light luminous flux/lm | Luminous power in a band of 350 nm-1000 nm/mW | Luminous power in a band of 650 nm-1000 nm (A)/mW | Luminous power in a band of 350 nm-650 nm (B)/mW | B/A*100% |
|---|---|---|---|---|---|---|---|---|
| Embodiment 1 | 65% | 18 μm | 0.003 | 3.5 | 749 | 720 | 29 | 4 |
| Embodiment 2 | 65% | 33 μm | 0.005 | 4.2 | 711 | 697 | 14 | 2 |
| Embodiment 3 | 70% | 20 μm | 0.006 | 4.5 | 675 | 670 | 5 | 0.8 |
| Embodiment 4 | 80% | 29 μm | 0.01 | 5.6 | 659 | 658 | 1 | 0.1 |
| Embodiment 5 | 80% | 30 μm | 0.003 | 10 | 666 | 640 | 26 | 4 |
| Embodiment 6 | 60% | 35 μm | 0.01 | 12 | 664 | 632 | 32 | 5 |
| Embodiment 7 | 55% | 33 μm | 0.05 | 15 | 663 | 625 | 38 | 6 |
| Embodiment 8 | 65% | 26 μm | 0.002 | 8 | 667 | 618 | 49 | 8 |
| Embodiment 9 | 45% | 40 μm | 0.001 | 6 | 593 | 576 | 17 | 3 |
| Embodiment 10 | 80% | 38 μm | 0.003 | 9 | 631 | 590 | 41 | 7 |
| Embodiment 11 | 82% | 35 μm | 0.03 | 11 | 621 | 570 | 51 | 9 |
| Embodiment 12 | 80% | 26 μm | 0.02 | 8 | 582 | 549 | 33 | 6 |
| Embodiment 13 | 70% | 15 μm | | 20 | 634 | 610 | 24 | 4 |

TABLE 1-continued

| | | | | | | | | |
|---|---|---|---|---|---|---|---|---|
| Embodiment 14 | 80% | 35 μm | | 18 | 657 | 608 | 49 | 8 |
| Embodiment 15 | 50% | 10 μm | | 5.4 | 781 | 710 | 71 | 10 |
| Embodiment 16 | 50% | 10 μm | | 6 | 765 | 695 | 70 | 10 |
| Embodiment 17 | 78% | 28.0 μm | 0.006 | 5.8 | 657 | 620 | 37 | 6 |
| Embodiment 18 | 60% | 45 μm | 0.01 | 4.5 | 704 | 658 | 46 | 7 |

As can be seen from the table above, the data in the above table show that fluorescent powder in the optical device according to the present invention can be effectively excited by the LED chip; and the optical device combining the visible-light luminescent material, the near-infrared luminescent material and the light absorber material can enable dual emission of white light and near-infrared light, and can effectively adjust and control the luminous power of the white light part and the near-infrared light. The optical device has good application prospects in security and other fields.

In summary, the present invention provides an optical device, which includes an LED chip, a light absorber and/or visible-light luminescent material and a near-infrared luminescent material, wherein a luminous power of light emitted by the near-infrared luminescent material and the light absorber and/or visible-light luminescent material in a band of 650-1000 nm under the excitation of the LED chip is A, and a sum of a luminous power of light emitted by the near-infrared and visible-light luminescent materials in a band of 350-650 nm under the excitation of the LED chip and a luminous power of residual light emitted by the LED chip in the band of 350-650 nm after the LED chip excites the near-infrared and visible-light luminescent materials is B, with B/A*100% being 0.1%-10%. According to the implementation where the optical device employs the LED chip to combine the near-infrared luminescent material and the light absorber and/or visible-light luminescent material simultaneously, the emissions of near-infrared light and visible light are simultaneously enabled by using the same LED chip to obtain strong near-infrared light and weak visible light. Moreover, a packaging process is simplified, the packaging cost is reduced, and the characteristics of high luminous efficiency and excellent reliability are achieved.

It should be understood that the foregoing specific embodiments of the present invention are merely for a purpose of illustrating or explaining the principle of the present invention by way of example, and not intended to limit the present invention. Therefore, any modifications, equivalent substitutions, improvements and the like made without departing from the spirit and scope of the present invention shall be included within the protection scope of the present invention. In addition, the appended claims of the present invention are intended to cover all variations and modifications that fall within the scope and boundary of the appended claims, or the equivalent forms of such scope and boundary.

The invention claimed is:

1. An optical device, comprising an LED chip, a light absorber and/or visible-light luminescent material and a near-infrared luminescent material, wherein a luminous power of light emitted by the near-infrared luminescent material and the light absorber and/or visible-light luminescent material in a band of 650-1000 nm under the excitation of the LED chip is A, and a sum of a luminous power of light emitted by the near-infrared and visible-light luminescent materials in a band of 350-650 nm under the excitation of the LED chip and a luminous power of residual light emitted by the LED chip in the band of 350-650 nm after the LED chip excites the near-infrared and visible-light luminescent materials is B, with B/A*100% being 0.1%-10%.

2. The optical device according to claim 1, wherein the LED chip has a peak-emission wavelength in a range of 420-470 nm.

3. The optical device according to claim 2, wherein the light absorber has a molecular formula being one or two of $(La,Y,Lu)_{3-x}Si_6N_{11}:xCe^{3+}$ and $(Lu,Y,Gd)_{3-y}(Al,Ga)_5O_{12}:yCe^{3+}$, with $0.35 \leq x \leq 1.5$ and $0.15 \leq y \leq 0.45$.

4. The optical device according to claim 3, wherein the light absorber can absorb an emitted light with a peak-emission wavelength of 420-470 nm, and emit visible light in a band of 500-780 nm under the excitation at 460 nm, and the external quantum efficiency of the light absorber is 0.001-0.05.

5. The optical device according to claim 4, wherein the near-infrared luminescent material comprises one of molecular formulas comprising $aSc_2O_3 \cdot A_2O_3 \cdot bCr_2O_3$ and $Ln_2O_3 \cdot cE_2O_3 \cdot dCr_2O_3$, the element A containing at least one of elements Al and Ga and necessarily containing the element Ga, the element Ln containing at least one of elements Y, Lu, and Gd and necessarily containing the element Y, and the element E containing at least one of elements Al and Ga and necessarily containing the element Ga, with $0.001 \leq a \leq 0.6$, $0.001 \leq b \leq 0.1$, $1.5 \leq c \leq 2$ and $0.001 \leq d \leq 0.2$; and the two molecular formulas have a $\beta$-$Ga_2O_3$ structure and a garnet structure, respectively.

6. The optical device according to claim 5, wherein the near-infrared luminescent material of the $\beta$-$Ga_2O_3$ structure can further contain an element In.

7. The optical device according to claim 5, wherein the near-infrared luminescent material has a median grain size D50 of 15-40 μm, and the mass of the near-infrared luminescent material accounts for 50-80% of a sum of the mass of the near-infrared luminescent material and a mass of the light absorber and/or visible-light luminescent material.

8. The optical device according to claim 2, wherein the visible-light luminescent material has one or two of molecular formulas comprising $(La,Y,Lu)_{3-e}Si_6N_{11}:eCe^{3+}$ and $(Lu,Y,Gd)_{3-z}(Al,Ga)_5O_{12}:zCe^{3+}$, with $0.001 \leq e \leq 0.15$ and $0.001 \leq z \leq 0.15$.

9. The optical device according to claim 2, wherein the near-infrared luminescent material comprises one of molecular formulas comprising $aSc_2O_3 \cdot A_2O_3 \cdot bCr_2O_3$ and $Ln_2O_3 \cdot cE_2O_3 \cdot dCr_2O_3$, the element A containing at least one of elements Al and Ga and necessarily containing the element Ga, the element Ln containing at least one of elements Y, Lu, and Gd and necessarily containing the element Y; the element E containing at least one of elements Al and Ga and necessarily containing the element Ga, with $0.001 \leq a \leq 0.6$, $0.001 \leq b \leq 0.1$, $1.5 \leq c \leq 2$, and $0.001 \leq d \leq 0.2$; and the two molecular formulas have a $\beta$-$Ga_2O_3$ structure and a garnet structure, respectively.

10. The optical device according to claim 9, wherein the near-infrared luminescent material of the $\beta$-$Ga_2O_3$ structure can further contain an element In.

11. The optical device according to claim 9, wherein the near-infrared luminescent material has a median grain size D50 of 15-40 μm, and the mass of the near-infrared luminescent material accounts for 50-80% of a sum of the mass of the near-infrared luminescent material and a mass of the light absorber and/or visible-light luminescent material.

12. The optical device according to claim 2, wherein the near-infrared luminescent material is located above the LED chip, and the light absorber and/or visible-light luminescent material is located above the near-infrared luminescent material.

* * * * *